United States Patent
Zhang et al.

(10) Patent No.: US 10,501,671 B2
(45) Date of Patent: Dec. 10, 2019

(54) GEL-TYPE THERMAL INTERFACE MATERIAL

(71) Applicant: Honeywell International Inc., Morris Plains, NJ (US)

(72) Inventors: Liqiang Zhang, Shanghai (CN); Huifeng Duan, Shanghai (CN); Kai Zhang, Shanghai (CN); Ya Qun Liu, Shanghai (CN); Ling Shen, Shanghai (CN); Wei Jun Wang, Shanghai (CN); Haigang Kang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 96 days.

(21) Appl. No.: 15/642,082

(22) Filed: Jul. 5, 2017

(65) Prior Publication Data

US 2018/0030327 A1    Feb. 1, 2018

Related U.S. Application Data

(60) Provisional application No. 62/436,746, filed on Dec. 20, 2016, provisional application No. 62/366,704, filed on Jul. 26, 2016.

(51) Int. Cl.
*C09K 5/14* (2006.01)
*C08K 3/22* (2006.01)
*H05K 7/20* (2006.01)

(52) U.S. Cl.
CPC .................. *C09K 5/14* (2013.01); *C08K 3/22* (2013.01); *H05K 7/2039* (2013.01); *C08K 2003/2227* (2013.01); *C08K 2003/2296* (2013.01); *C08K 2201/001* (2013.01); *C08K 2201/014* (2013.01)

(58) Field of Classification Search
CPC .......... C09K 5/14; H05K 7/2039; C08K 3/22; C08K 2201/001; C08K 2201/014; C08K 2003/2296; C08K 2003/2227
See application file for complete search history.

(56) References Cited

U.S. PATENT DOCUMENTS

| | | |
|---|---|---|
| 4,180,498 A | 12/1979 | Spivack |
| 4,446,266 A | 5/1984 | von Gentzkow et al. |
| 4,459,185 A | 7/1984 | Obata et al. |
| 4,565,610 A | 1/1986 | Nobel et al. |
| 4,604,424 A | 8/1986 | Cole et al. |
| 5,162,555 A | 11/1992 | Remmers et al. |
| 5,167,851 A | 12/1992 | Jamison et al. |
| 5,562,814 A | 10/1996 | Kirby |
| 6,040,362 A | 3/2000 | Mine et al. |
| 6,096,414 A | 8/2000 | Young |
| 6,238,596 B1 | 5/2001 | Nguyen et al. |
| 6,339,120 B1 | 1/2002 | Misra et al. |
| 6,372,337 B2 | 4/2002 | Takahashi et al. |
| 6,372,997 B1 | 4/2002 | Hill et al. |
| 6,391,442 B1 | 5/2002 | Duvall et al. |
| 6,400,565 B1 | 6/2002 | Shabbir et al. |
| 6,432,320 B1 | 8/2002 | Bonsignore et al. |
| 6,432,497 B2 | 8/2002 | Bunyan |
| 6,451,422 B1 | 9/2002 | Nguyen |
| 6,475,962 B1 | 11/2002 | Khatri |
| 6,496,373 B1 | 12/2002 | Chung |
| 6,500,891 B1 | 12/2002 | Kropp et al. |
| 6,562,180 B1 | 5/2003 | Bohin et al. |
| 6,597,575 B1 | 7/2003 | Matayabas et al. |
| 6,605,238 B2 | 8/2003 | Nguyen et al. |
| 6,610,635 B2 | 8/2003 | Khatri |
| 6,616,999 B1 | 9/2003 | Freuler et al. |
| 6,617,517 B2 | 9/2003 | Hill et al. |
| 6,620,515 B2 | 9/2003 | Feng et al. |
| 6,624,224 B1 | 9/2003 | Misra |
| 6,649,325 B1 | 11/2003 | Gundale et al. |
| 6,657,297 B1 | 12/2003 | Jewram et al. |
| 6,673,434 B2 | 1/2004 | Nguyen |
| 6,706,219 B2 | 3/2004 | Nguyen |
| 6,761,928 B2 | 7/2004 | Hill et al. |
| 6,764,759 B2 | 7/2004 | Duvall et al. |
| 6,783,692 B2 | 8/2004 | Bhagwagar |
| 6,791,839 B2 | 9/2004 | Bhagwagar |
| 6,797,382 B2 | 9/2004 | Nguyen et al. |
| 6,797,758 B2 | 9/2004 | Misra et al. |
| 6,811,725 B2 | 11/2004 | Nguyen et al. |
| 6,815,486 B2 | 11/2004 | Bhagwagar et al. |
| 6,835,453 B2 | 12/2004 | Greenwood et al. |
| 6,838,182 B2 | 1/2005 | Kropp et al. |
| 6,874,573 B2 | 4/2005 | Collins et al. |
| 6,900,163 B2 | 5/2005 | Khatri |

(Continued)

FOREIGN PATENT DOCUMENTS

| CA | 2311067 A1 | 1/2001 |
|---|---|---|
| CN | 1407141 A | 4/2003 |

(Continued)

OTHER PUBLICATIONS

Wacker Silicones, Catalyst EP/Inhibitor PT 88 product data sheet, p. 1-3, Oct. 6, 2008.*
"Dynasylan 1146: Oligomeric Diamino-Silane-System" Evonik Industries, pp. 1-3, 2008.
"Semicosil 9212A" Wacker Silicones Material Safety Data Sheet, pp. 1-8, printed Dec. 11, 2009.
"Semicosil 9212B." Wacker Silicones Material Safety Data Sheet, pp. 1-8, printed Dec. 11, 2009.
Extended European Search Report issued in EP Application No. 14897036.1, dated Jul. 2, 2018, 7 pages.
Extended Search Report issued in EP Application 14907530.1, dated Jun. 27, 2018, 9 pages.

(Continued)

*Primary Examiner* — Robert S Jones
(74) *Attorney, Agent, or Firm* — Faegre Baker Daniels LLP (57) ABSTRACT

A thermal interface material that is useful in transferring heat from heat generating electronic devices, such as computer chips, to heat dissipating structures, such as heat spreaders and heat sinks. The thermal interface material includes at least one silicone oil, and at least one thermally conductive filler.

19 Claims, 5 Drawing Sheets

(56) References Cited

U.S. PATENT DOCUMENTS

| | | |
|---|---|---|
| 6,908,669 B2 | 6/2005 | Nguyen |
| 6,908,682 B2 | 6/2005 | Mistele |
| 6,913,686 B2 | 7/2005 | Hilgarth |
| 6,926,955 B2 | 8/2005 | Jayaraman et al. |
| 6,940,721 B2 | 9/2005 | Hill |
| 6,946,190 B2 | 9/2005 | Bunyan |
| 6,975,944 B1 | 12/2005 | Zenhausern |
| 6,984,685 B2 | 1/2006 | Misra et al. |
| 7,013,965 B2 | 3/2006 | Zhong et al. |
| 7,056,566 B2 | 6/2006 | Freuler et al. |
| 7,074,490 B2 | 7/2006 | Feng et al. |
| 7,078,109 B2 | 7/2006 | Hill et al. |
| 7,135,232 B2 | 11/2006 | Yamada et al. |
| 7,147,367 B2 | 12/2006 | Balian et al. |
| 7,172,711 B2 | 2/2007 | Nguyen |
| 7,241,707 B2 | 7/2007 | Meagley et al. |
| 7,244,491 B2 | 7/2007 | Nguyen |
| 7,291,396 B2 | 11/2007 | Huang et al. |
| 7,294,394 B2 | 11/2007 | Jayaraman et al. |
| RE39,992 E | 1/2008 | Misra et al. |
| 7,328,547 B2 | 2/2008 | Mehta et al. |
| 7,369,411 B2 | 5/2008 | Hill et al. |
| 7,462,294 B2 | 12/2008 | Kumar et al. |
| 7,465,605 B2 | 12/2008 | Raravikar et al. |
| 7,550,097 B2 | 6/2009 | Tonapi et al. |
| 7,572,494 B2 | 8/2009 | Mehta et al. |
| 7,641,811 B2 | 1/2010 | Kumar et al. |
| 7,682,690 B2 | 3/2010 | Bunyan et al. |
| 7,695,817 B2 | 4/2010 | Lin et al. |
| 7,700,943 B2 | 4/2010 | Raravikar et al. |
| 7,744,991 B2 | 6/2010 | Fischer et al. |
| RE41,576 E | 8/2010 | Bunyan et al. |
| 7,816,785 B2 | 10/2010 | Iruvanti et al. |
| 7,646,778 B2 | 12/2010 | Rumer et al. |
| 7,850,870 B2 | 12/2010 | Ahn et al. |
| 7,867,609 B2 | 1/2011 | Nguyen |
| 7,955,900 B2 | 6/2011 | Jadhav et al. |
| 7,960,019 B2 | 6/2011 | Jayaraman et al. |
| 8,039,961 B2 | 10/2011 | Suhir et al. |
| 8,076,773 B2 | 12/2011 | Jewram et al. |
| 8,081,468 B2 | 12/2011 | Hill et al. |
| 8,105,504 B2 | 1/2012 | Gerster et al. |
| 8,110,919 B2 | 2/2012 | Jewram et al. |
| 8,138,239 B2 | 3/2012 | Prack et al. |
| 8,223,498 B2 | 7/2012 | Lima |
| 8,308,861 B2 | 11/2012 | Rolland et al. |
| 8,324,313 B2 | 12/2012 | Funahashi |
| 8,373,283 B2 | 2/2013 | Masuko et al. |
| 8,431,647 B2 | 4/2013 | Dumont et al. |
| 8,431,655 B2 | 4/2013 | Dershem |
| 8,445,102 B2 | 5/2013 | Strader et al. |
| 8,518,302 B2 | 8/2013 | Gerster et al. |
| 8,535,478 B2 | 9/2013 | Pouchelon et al. |
| 8,535,787 B1 | 9/2013 | Lima |
| 8,557,896 B2 | 10/2013 | Jeong et al. |
| 8,586,650 B2 | 11/2013 | Zhang et al. |
| 8,587,945 B1 | 11/2013 | Hartmann et al. |
| 8,618,211 B2 | 12/2013 | Bhagwagar et al. |
| 8,632,879 B2 | 1/2014 | Weisenberger |
| 8,633,478 B2 | 1/2014 | Cummings et al. |
| 8,638,001 B2 | 1/2014 | Kimura et al. |
| 8,647,752 B2 | 2/2014 | Strader et al. |
| 8,758,892 B2 | 6/2014 | Bergin et al. |
| 8,796,068 B2 | 8/2014 | Stender et al. |
| 8,837,151 B2 | 9/2014 | Hill et al. |
| 8,865,800 B2 | 10/2014 | Stammer et al. |
| 8,917,510 B2 | 12/2014 | Boday et al. |
| 8,937,384 B2 | 1/2015 | Bao et al. |
| 9,055,694 B2 | 6/2015 | Lima |
| 9,070,660 B2 | 6/2015 | Lowe et al. |
| 9,080,000 B2 | 7/2015 | Ahn et al. |
| 9,222,735 B2 | 12/2015 | Hill et al. |
| 9,260,645 B2 | 2/2016 | Bruzda |
| 9,392,730 B2 | 7/2016 | Hartmann et al. |
| 9,481,851 B2 | 11/2016 | Matsumoto et al. |
| 9,527,988 B2 | 12/2016 | Habimana et al. |
| 9,537,095 B2 | 1/2017 | Stender et al. |
| 9,593,209 B2 | 3/2017 | Dent et al. |
| 9,593,275 B2 | 3/2017 | Tang et al. |
| 9,598,575 B2 | 3/2017 | Bhagwagar et al. |
| 10,155,894 B2 | 12/2018 | Liu et al. |
| 2002/0018885 A1 | 2/2002 | Takahashi et al. |
| 2002/0132896 A1 | 9/2002 | Nguyen |
| 2003/0112603 A1 | 6/2003 | Roesner et al. |
| 2003/0128521 A1* | 7/2003 | Matayabas, Jr. .... H01L 23/3737 361/705 |
| 2003/0151030 A1 | 8/2003 | Gurin |
| 2003/0159938 A1 | 8/2003 | Hradil |
| 2003/0203181 A1 | 10/2003 | Ellsworth et al. |
| 2003/0207064 A1 | 11/2003 | Bunyan et al. |
| 2003/0207128 A1 | 11/2003 | Uchiya et al. |
| 2003/0230403 A1 | 12/2003 | Webb |
| 2004/0069454 A1 | 4/2004 | Bonsignore et al. |
| 2004/0097635 A1 | 5/2004 | Fan et al. |
| 2004/0149587 A1 | 8/2004 | Hradil |
| 2004/0161571 A1 | 8/2004 | Duvall et al. |
| 2004/0206941 A1 | 10/2004 | Gurin |
| 2005/0020738 A1 | 1/2005 | Jackson et al. |
| 2005/0025984 A1 | 2/2005 | Odell et al. |
| 2005/0072334 A1 | 4/2005 | Czubarow et al. |
| 2005/0148721 A1 | 7/2005 | Tonapi et al. |
| 2005/0228097 A1 | 10/2005 | Zhong |
| 2005/0287362 A1 | 12/2005 | Garcia-Ramirez et al. |
| 2006/0057364 A1 | 3/2006 | Nguyen |
| 2006/0094809 A1* | 5/2006 | Simone .................. C09J 9/02 524/431 |
| 2006/0208354 A1 | 9/2006 | Liu et al. |
| 2006/0228542 A1 | 10/2006 | Czubarow |
| 2006/0260948 A2 | 11/2006 | Zschintzsch et al. |
| 2006/0264566 A1 | 11/2006 | Cassar et al. |
| 2007/0051773 A1 | 3/2007 | Ruchert et al. |
| 2007/0097651 A1 | 5/2007 | Canale et al. |
| 2007/0131913 A1 | 6/2007 | Cheng et al. |
| 2007/0161521 A1 | 7/2007 | Sachdev et al. |
| 2007/0164424 A1 | 7/2007 | Dean et al. |
| 2007/0179232 A1 | 8/2007 | Collins et al. |
| 2007/0249753 A1 | 10/2007 | Lin et al. |
| 2008/0044670 A1 | 2/2008 | Nguyen |
| 2008/0116416 A1 | 5/2008 | Chacko |
| 2008/0141629 A1 | 6/2008 | Alper et al. |
| 2008/0149176 A1 | 6/2008 | Sager et al. |
| 2008/0291634 A1* | 11/2008 | Weiser .................. C09K 5/14 361/708 |
| 2006/0302064 | 12/2008 | Rauch |
| 2009/0111925 A1 | 4/2009 | Burnham et al. |
| 2009/0184283 A1 | 7/2009 | Chung et al. |
| 2010/0048435 A1 | 2/2010 | Yamagata et al. |
| 2010/0048438 A1 | 2/2010 | Carey et al. |
| 2010/0075135 A1* | 3/2010 | Kendall .................. C08K 3/20 428/323 |
| 2010/0129648 A1 | 5/2010 | Xu et al. |
| 2010/0197533 A1 | 8/2010 | Kendall et al. |
| 2011/0121435 A1 | 5/2011 | Mitsukura et al. |
| 2011/0141698 A1 | 6/2011 | Chiou et al. |
| 2011/0187009 A1 | 8/2011 | Masuko et al. |
| 2011/0192564 A1 | 8/2011 | Mommer et al. |
| 2011/0204280 A1 | 8/2011 | Bruzda |
| 2011/0265979 A1 | 11/2011 | Chen et al. |
| 2011/0294958 A1 | 12/2011 | Ahn et al. |
| 2011/0308782 A1 | 12/2011 | Merrill et al. |
| 2012/0060826 A1 | 3/2012 | Weisenberger |
| 2012/0195822 A1 | 8/2012 | Werner et al. |
| 2012/0253033 A1 | 10/2012 | Boucher et al. |
| 2012/0285673 A1 | 11/2012 | Cola et al. |
| 2012/0288725 A1 | 11/2012 | Tanaka et al. |
| 2013/0199724 A1 | 8/2013 | Dershem |
| 2013/0248163 A1 | 9/2013 | Bhagwagar et al. |
| 2013/0265721 A1 | 10/2013 | Strader et al. |
| 2013/0288462 A1 | 10/2013 | Stender et al. |
| 2013/0299140 A1 | 11/2013 | Ling et al. |
| 2014/0190672 A1 | 7/2014 | Swaroop et al. |
| 2015/0125646 A1 | 5/2015 | Tournilhac et al. |
| 2015/0138739 A1 | 5/2015 | Hishiki |
| 2015/0158982 A1 | 6/2015 | Saito et al. |

(56) References Cited

U.S. PATENT DOCUMENTS

| | | |
|---|---|---|
| 2015/0183951 A1 | 7/2015 | Bhagwagar et al. |
| 2015/0275060 A1 | 10/2015 | Kuroda et al. |
| 2015/0279762 A1 | 10/2015 | Lowe et al. |
| 2016/0160102 A1 | 6/2016 | Minegishi et al. |
| 2016/0160104 A1 | 6/2016 | Bruzda et al. |
| 2016/0226114 A1 | 8/2016 | Hartmann et al. |
| 2016/0272839 A1 | 9/2016 | Yamamoto et al. |
| 2017/0009362 A1 | 1/2017 | Werner et al. |
| 2017/0107415 A1 | 4/2017 | Shiono |
| 2017/0137685 A1 | 5/2017 | Liu et al. |
| 2017/0167716 A1 | 6/2017 | Ezaki et al. |
| 2017/0226396 A1 | 8/2017 | Yang et al. |
| 2017/0317257 A1 | 11/2017 | Ezaki et al. |
| 2017/0321100 A1 | 11/2017 | Zhang et al. |
| 2018/0030328 A1 | 2/2018 | Zhang et al. |
| 2018/0085977 A1 | 3/2018 | Ezaki |
| 2018/0194982 A1 | 7/2018 | Ezaki et al. |
| 2018/0267315 A1 | 9/2018 | Yonemura |
| 2018/0358283 A1 | 12/2018 | Zhang et al. |
| 2019/0048245 A1 | 2/2019 | Liu et al. |
| 2019/0078007 A1 | 3/2019 | Zhang et al. |

FOREIGN PATENT DOCUMENTS

| | | |
|---|---|---|
| CN | 1456710 A | 11/2003 |
| CN | 1549875 A | 11/2004 |
| CN | 1970666 A | 5/2007 |
| CN | 101067030 A | 11/2007 |
| CN | 101090922 B | 12/2007 |
| CN | 101445627 A | 6/2009 |
| CN | 101735619 B | 6/2010 |
| CN | 101835830 B | 9/2010 |
| CN | 102134474 B | 7/2011 |
| CN | 102341474 B | 2/2012 |
| CN | 102627943 A | 8/2012 |
| CN | 102634212 A * | 8/2012 |
| CN | 102348763 B | 4/2013 |
| CN | 103087389 A | 5/2013 |
| CN | 103102552 A | 5/2013 |
| CN | 103102689 A | 5/2013 |
| CN | 103131138 B | 6/2013 |
| CN | 103214848 A | 7/2013 |
| CN | 103254647 A | 8/2013 |
| CN | 103333447 A | 10/2013 |
| CN | 103409116 B | 11/2013 |
| CN | 103436027 B | 12/2013 |
| CN | 103709757 A | 4/2014 |
| CN | 103756631 A | 4/2014 |
| CN | 103773322 A | 5/2014 |
| CN | 103849356 A | 6/2014 |
| CN | 103865271 B | 6/2014 |
| CN | 104098914 A | 10/2014 |
| CN | 104140678 B | 11/2014 |
| CN | 104152103 A | 11/2014 |
| CN | 104449550 A | 3/2015 |
| CN | 104497574 A | 4/2015 |
| CN | 104513487 A | 4/2015 |
| CN | 104804705 A | 7/2015 |
| CN | 104861661 A | 8/2015 |
| CN | 105111750 A | 12/2015 |
| CN | 105349113 A | 2/2016 |
| CN | 105419339 A | 3/2016 |
| CN | 105670555 A | 6/2016 |
| CN | 105838322 A | 8/2016 |
| CN | 105925243 A | 9/2016 |
| CN | 105980512 A | 9/2016 |
| CN | 107057370 A | 8/2017 |
| EP | 1224669 B1 | 7/2002 |
| EP | 1149519 B1 | 11/2004 |
| EP | 1514956 B1 | 3/2005 |
| EP | 1629059 B1 | 3/2006 |
| EP | 2194165 A1 | 6/2010 |
| FR | 2848215 A1 | 6/2004 |
| GB | 2508320 B | 5/2014 |
| JP | 57027188 B | 6/1982 |
| JP | 0543116 B2 | 5/1986 |
| JP | 3662715 B2 | 1/1991 |
| JP | 02611364 B2 | 5/1997 |
| JP | 2000143808 A | 5/2000 |
| JP | 2001139818 A | 5/2001 |
| JP | 2002003830 A | 1/2002 |
| JP | 100479857 B1 | 7/2003 |
| JP | 2007002002 A | 1/2007 |
| JP | 4016326 B2 | 12/2007 |
| JP | 2008063412 A | 3/2008 |
| JP | 5269366 B2 | 3/2009 |
| JP | 2009102577 A | 5/2009 |
| JP | 5137538 B2 | 6/2009 |
| JP | 2009138036 A | 6/2009 |
| JP | 4288469 B2 | 7/2009 |
| JP | 5607298 B2 | 3/2010 |
| JP | 5390202 B2 | 8/2010 |
| JP | 2010248277 A | 11/2010 |
| JP | 2010278115 A | 12/2010 |
| JP | 5318733 B2 | 6/2011 |
| JP | 2011165792 A | 8/2011 |
| JP | 5687167 B2 | 4/2013 |
| JP | 5463116 B2 | 4/2014 |
| JP | 5944306 B2 | 7/2014 |
| JP | 5372270 B1 | 9/2014 |
| JP | 2014194006 A | 10/2014 |
| KR | 20070116654 A | 12/2007 |
| TW | 201527309 A | 7/2015 |
| WO | 1997026297 A1 | 7/1997 |
| WO | WO0120618 A1 | 3/2001 |
| WO | WO03052818 A1 | 6/2003 |
| WO | 2003064148 A1 | 8/2003 |
| WO | 2004008497 A2 | 1/2004 |
| WO | 2004022330 A1 | 3/2004 |
| WO | WO2005021257 A1 | 3/2005 |
| WO | 200511146 A1 | 11/2005 |
| WO | 2005119771 A1 | 12/2005 |
| WO | WO2006023860 A2 | 3/2006 |
| WO | 2007027670 A1 | 3/2007 |
| WO | 2006014171 A2 | 1/2008 |
| WO | WO2008103219 A1 | 8/2008 |
| WO | 2008121491 A1 | 10/2008 |
| WO | 2008121970 A1 | 10/2008 |
| WO | 2009032212 A1 | 3/2009 |
| WO | 2013191116 A1 | 12/2013 |
| WO | 2014007119 A1 | 1/2014 |
| WO | 2014160067 A1 | 10/2014 |
| WO | 2015179056 A1 | 11/2015 |
| WO | 2016004565 A1 | 1/2016 |
| WO | 2016103424 A1 | 6/2016 |
| WO | WO2018068222 A1 | 4/2018 |

OTHER PUBLICATIONS

Fink, Johannes Karl. "Chapter 18: Metal Deactivators." in: A Concise Introduction to Additives for Thermoplastic Polymers, Wiley-Scrivener, pp. 165-171, Jan. 1, 2010.

Singaporean Search Report and Written Opinion issued in SG Application No. 11201704238Y, completed May 18, 2018, 9 pages.

"Hi-Flow 225F-AC Reinforced, Phase Change Thermal Interlace Material," The Bergquist Company, 1 page, available at least as early as the filing date of the present application.

"THERM-A-GAP HCS10,569,570,579 and 580 Thermally Conductive Gap Filler Pads," Parker Chomerics, Engineering Your Success, pp. 11-12, available at least as early as the filing date of the present application.

Aranzabe, Estibaliz, et al. "More than Color: Pigments with Thermal Storage Capacity; Processing and Degradation Behavior." Advances in Materials Physics and Chemistry, 5:171-184, 2015.

Extended European Search Report issued in EP Application 14867847. 7, dated Jun. 26, 2017, 7 pages.

Gowda, Arun, et al. "Choosing the Right Thermal Interface Material." Solid State Technology, Insights for Electronics Manufacturing, Online Blog, 9 pages, 2005. Retrieved May 25, 2017 from the Internet <http://electroiq.com/blog/2005/03/choosing-the-right-therrnal-interface-material/.

(56) References Cited

OTHER PUBLICATIONS

International Search Report and Written Opinion issued in PCT/CN2014/081724. dated Apr. 1, 2015, 12 pages.
International Search Report and Written Opinion issued in PCT/CN2014/093138, dated Sep. 6 2015, 8 pages.
International Search Report and Written Opinion issued in PCT/CN2016/101874, dated Apr. 28, 2017, 12 pages.
International Search Report and Written Opinion issued in PCT/US2014/068033, dated Mar. 26, 2015, 12 pages.
International Search Report and Written Opinion issued in PCT/US2017/041498, dated Oct. 20, 2017, 10 pages.
Martyak et al., On the oxidation of tin(II) in methanesulfonate solutions and the role of sulfate, Gaivanotechnik (2005), 96(3), 594-601 (Abstract).
Ping, Ding, et al, "Preparation and Application Research of Novel Silicone Gel for High-Power IGBT." Insulating Materials, 47(2):52-55, Chinese text with English translation of Abstract, 2014.
Ramaswamy et al., Phase change materials as a viable thermal interface material for high-power electronic applications.
Ramaswamy, C., et al. "Phase Change Materials as a Viable Thermal Interface Material for High-Power Electronic Applications." The Ninth Intersociety Conference on Thermal and Thermomechanical Phenomena in Electronic Systems, IEEE, 2:687-691, 2004.
Search Report issued in CN application 201480066502.2, dated May 18, 2017, 2 pages.
Dow Coming® Two-Part RTV Silicone Sealant: Total Assembly Solutions for Home Appliance Production; www.dowcoming.com; Form No. 80-3375-01; 6 pages.
Evonik, Silanes for Adhesives and Sealants, 2013, p. 1-24.
International Preliminary Report on Patentability issued in PCT/CN2016/075827, dated Sep. 20, 2018, 5 pages.
International Search Report and Written Opinion issued in PCT/CN2016/075827, dated Dec. 1, 2016, 7 pages.
International Search Report and Written Opinion issued in PCT/US2018/049218, dated Dec. 28, 2018, 13 pages.
International Search Report and Written Opinion issued in PCT/US2018/056870, dated Feb. 8, 2019, 9 pages.
Singaporean Written Opinion issued in SG Application No. 11201704238Y, completed Feb. 7, 2019, 7 pages.
Yasuhiro Aoyagi et al., "Effects of antioxidants and the solild component on the thermal stability of polyol-ester-based thermal pastes", J Mater Sci (2007) 42:2358-2375; Mar. 12, 2007.
Yasuhiro Aoyagi et al., "Polyol-Based Phase-Change Thermal Interface Materials", Journal of Electronic Materials, vol. 35, No. 3, (2006); pp. 416-424.
Yunsheng Xu et al., "Lithium Doped Polyethylene-Glycol-Based Thermal Interface Pastes for High Thermal Contact Conductance", Transactions of the ASME; Journal of Electronic Packagiing, vol. 124, Sep. 2002; pp. 188-191.

* cited by examiner

*FIG. 4C* After thermal cycle

*FIG. 5C*
Ex. 2B

*FIG. 4B* After thermal cycle

*FIG. 5B*
Ex. 2A

*FIG. 4A* After thermal cycle

*FIG. 5A*
Comp. Ex. 2

GEL-TYPE THERMAL INTERFACE MATERIAL

CROSS-REFERENCE TO RELATED APPLICATIONS

This application claims priority to U.S. Provisional Patent Application Ser. No. 62/366,704, filed Jul. 26, 2016 and U.S. Provisional Patent Application Ser. No. 62/436,746, filed Dec. 20, 2016, the disclosures of which are hereby expressly incorporated by reference herein in their entireties.

FIELD OF THE INVENTION

The present disclosure relates generally to thermal interface materials, and more particularly to gel-type thermal interface materials.

DESCRIPTION OF THE RELATED ART

Thermal interface materials (TIMs) are widely used to dissipate heat from electronic components, such as central processing units, video graphics arrays, servers, game consoles, smart phones, LED boards, and the like. Thermal interface materials are typically used to transfer excess heat from the electronic component to a heat spreader, such as a heat sink.

Figure 1:
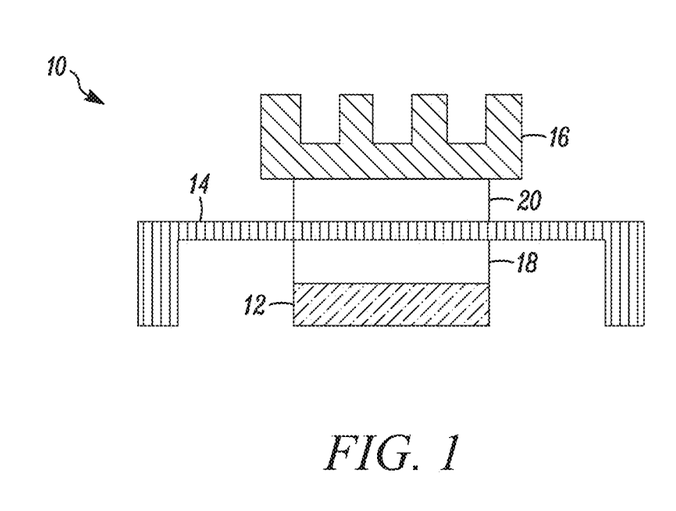
FIG. 1 schematically illustrates a typical electronics package structure.

A typical electronics package structure 10 including thermal interface materials is illustrated in FIG. 1. The electronics package structure 10 illustratively includes a heat generating component, such as an electronic chip 12, and one or more heat dissipating components, such as a heat spreader 14, and a heat sink 16. Illustrative heat spreaders 14 and heat sinks comprise a metal, metal alloy, or metal-plated substrate, such as copper, copper alloy, aluminum, aluminum alloy, or nickel-plated copper. TIM materials, such as TIM 18 and TIM 20, provide a thermal connection between the heat generating component and the one or more heat dissipating components. Electronics package structure 10 includes a first TIM 18 connecting the electronic chip 12 and heat spreader 14. TIM 18 is typically referred to as a "TIM 1". Electronics package structure 10 includes a second TIM 20 connecting the heat spreader 14 and heat sink 16, TIM 20 is typically referred to as a "TIM 2". In another embodiment, electronics package structure 10 does not include a heat spreader 14, and a TIM (not shown) connects the electronic chip 12 directly to the heat sink 16. Such a TIM connecting the electronic chip 12 directly to the heat sink 16 is typically referred to as a TIM 1.5.

Traditional thermal interface materials include components such as gap pads. However, gap pads have certain disadvantages, such as inability to meet very small thickness requirements and being difficult to use in automated production.

Other thermal interface materials include gel products. Gel products may be automatically dispensed for large scale production, and can be formed to desired shapes and thicknesses. However, typical gel products have issues with dripping and cracking in temperature cycling tests, including that the product may potentially be more likely to fail in extreme cases.

Improvements in the foregoing are desired.

SUMMARY OF THE INVENTION

The present disclosure provides thermal interlace materials that are useful in transferring heat from heat generating electronic devices, such as computer chips, to heat dissipating structures, such as heat spreaders and heat sinks. The thermal interface material includes at least one silicone oil, at least one thermally conductive filler, and at least one addition inhibitor.

In one exemplary embodiment, a thermal interface material is provided. The thermal interface material includes at least one low molecular weight silicone oil having a weight (Mw) average molecular weight less than 50,000 Daltons; at least one thermally conductive filler; at least one addition catalyst; and at least one high molecular weight silicone oil, wherein the high molecular weight silicone oil comprises a vinyl functional silicone oil having a weight (Mw) average molecular weight of at least 60,000 Daltons. In a more particular embodiment, the at least one low molecular weight silicone oil comprises a first silicone oil and a second silicone oil, wherein the first silicone oil is a vinyl functional silicone oil and the second silicone oil is a hydride functional silicone oil.

In a more particular embodiment, the thermally conductive filler includes a first thermally conductive filler and a second thermally conductive filler, wherein the first thermally conductive filer is a metal oxide having a particle size greater than 1 micron and the second thermally conductive filler is a metal oxide have a particle size less than 1 micron. In another more particular embodiment, the thermally conductive filler includes a first thermally conductive filler, a second thermally conductive filler, and a third thermally conductive filler, wherein the first thermally conductive filler is a metal oxide having an average particle size greater than 10 microns, the second thermally conductive flier is a metal oxide having an average particle size between 1 micron and 10 microns, and the third thermally conductive filler is a metal oxide having an average particle size less than 1 micron.

In still another more particular embodiment, the thermal interface material comprises: from 2 wt % to 20 wt. % of the low molecular weight silicone oil; from 50 wt % to 95 wt % of the thermally conductive filler; and from 0.1 wt % to 5 wt % of the high molecular weight silicone oil. In still another more particular embodiment, the low molecular weight silicone oil comprises a first silicone oil and a second silicone oil, wherein the first silicone oil is a vinyl functional silicone oil and the second silicone oil is a hydride functional silicone oil.

In a more particular embodiment of any of the above embodiments, a thermal interface material is provided. The thermal interface material comprises: at least one silicone oil; at least one thermally conductive tiller; and at least one addition inhibitor, wherein the addition inhibitor comprises an alkynyl compound. In a still more particular embodiment, the addition inhibitor is selected from the group consisting of: a multivinyl functional polysiloxane, polydimethylsiloxane vinyl terminated in ethynyl cyclohexanol, 2-methyl-3-butyn-2-ol, and 3-methyl-1-pentyn-3-ol. In a more particular embodiment of any of the above embodiments, the at least one silicone oil comprises a first silicone oil and a second silicone oil, wherein the first silicone oil is a vinyl functional silicone oil and the second silicone oil is a hydride functional silicone oil.

In a more particular embodiment of any of the above embodiments, the thermally conductive filler includes a first thermally conductive filler and a second thermally conductive filler, wherein the first thermally conductive filer is a metal having a particle size greater than 1 micron and the second thermally conductive filler is a metal oxide having a particle size less than 1 micron. In a more particular embodiment of any of the above embodiments, a ratio of the first thermally conductive filler to the second thermally conductive filler is from 1.5:1 to 3:1.

In a more particular embodiment of any of the above embodiments, the thermal interface material comprises: from 2 wt. % to 20 wt. % of the silicone oil; from 0.1 wt. % to 5 wt. % of a silane coupling agent; from 50 wt. % to 95 wt. % of the thermally conductive filler; and from 0.01 wt. % to 5 wt. % of the addition inhibitor. In a more particular embodiment, the addition inhibitor is polydimethylsiloxane vinyl terminated in ethynyl cyclohexanol. In a more particular embodiment, the silicone oil comprises a first silicone oil and a second silicone oil, wherein the first silicone oil is a vinyl functional silicone oil and the second silicone oil is a hydride functional silicone oil.

In one exemplary embodiment, an electronic component is provided. The electronic component includes a heat sink; an electronic chip; a thermal interface material having a first surface layer and a second surface layer, the thermal interface material positioned between the heat sink and electronic chip, the thermal interface material including: at least one silicone oil; at least one thermally conductive filler; and at least one addition inhibitor, wherein the addition inhibitor comprises an alkynyl compound. In a more particular embodiment, the at least one silicone comprises at least one low molecular weight silicone oil and at least one high molecular weight silicone oil.

In a more particular embodiment, the at least one high molecular weight silicone oil comprises a vinyl functional silicone oil having a weight (Mw) average molecular weight of at least 60,000 Daltons. In another more particular embodiment, the first surface layer is in contact with a surface of the electronic chip and the second surface layer is in contact with the heat sink. In another more particular embodiment, the electronic component further comprises a heat spreader positioned between the heat sink and the electronic chip, wherein the first surface layer is in contact with a surface of the electronic chip and the second surface layer is in contact with the heat spreader. In a further more particular embodiment, the electronic component further comprises a heat spreader positioned between the heat sink and the electronic chip, wherein the first surface layer is in contact with a surface of the heat spreader and the second surface layer is in contact with the heat sink.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION

A. Thermal Interface Material

The present invention relates to thermal interface materials (TIMs) useful in transferring heat away from electronic components. In one exemplary embodiment, the TIM comprises at least one silicone oil, at least one catalyst, at least one thermally conductive filler, and at least one adhesion promoter including both amine and alkyl functional groups.

In some embodiments, the TIM may optionally include one or more of the following components: a silane coupling agent, an organic plasticizer, a surfactant, and a flux agent.

1. Silicone Oil a. General Description

The present disclosure provides a matrix for a TIM material that includes at least one low molecular weight silicone oil and at least one high molecular weight silicone oil. The silicone oil includes one or more crosslinkable groups, such as vinyl, hydride, hydroxyl and acrylate functional groups, that are crosslinked by a catalyst. In one embodiment, one or more silicone oils include a first silicone oil and a second silicone oil, where the first silicone oil is a vinyl functional silicone oil and the second silicone oil is a hydride functional silicone oil. The silicone oil wets the thermally conductive filler and forms a dispensable fluid for the TIM.

In one exemplary embodiment, the silicone oil includes a silicone rubber such as the KE series products available from Shin-Etsu, such as SILBIONE® available from Bluestar, such as ELASTOSIL®, SILPURAN®, and SEMICOSIL® available from Wacker, such as Silopren® available from Momentive, such as Dow Corning®, Silastic®, XIAMETER®, Syl-off® and SYLGARD® available from Dow Corning, such as SQUARE® available from Square Silicone, such as Andril® available from AB specialty Silicones. Other polysiloxanes are available from Wacker, Shin-etsu, Dowcoring, Momentive, Bluestar, RUNHE, AB Specialty Silicones, Gelest, and United Chemical Technologies.

b. Low Molecular Weight Silicone Oil

1. Vinyl Functional Silicone Oil

The TIM includes a low weight average molecular weight silicone oil as measured by gel permeation chromatography (GPC). Exemplary low molecular weight silicone oils may include a vinyl silicone oil having a general formula as shown below:

An exemplary low molecular weight vinyl silicone oil may also include a small amount of platinum catalyst.

Vinyl functional silicone oils include an organo-silicone component with Si—CH=$CH_2$ groups. Exemplary vinyl functional silicone oils include vinyl-terminated silicone oils and vinyl-grafted silicone oils in which the Si—CH=$CH_2$ group is grafted onto the polymer chain, and combinations thereof.

Exemplary vinyl-terminated silicone oils include vinyl terminated polydimethylsiloxane, such as DMS-V00 (having a weight average molecular weight ($M_w$) of 186 Daltons), DMS-V03 (having a $M_w$ of about 500 Daltons), DMS-V05 (having a $M_w$ of about 800 Daltons), DMS-V21 (having a $M_w$ of about 6,000 Daltons), DMS-V22 (having a $M_w$ of about 9400 Daltons), DMS-V25 (having a $M_w$ of about 17,200 Daltons), DMS-V25R (having a $M_w$ of about 17,200 Daltons), DMS-V35 (having a $M_w$ of about 49,500 Daltons), DMS-V35R (having a $M_w$ of about 49,500 Daltons), each available from Gelest, Inc. Exemplary vinyl-terminated silicone oils include vinyl terminated diphenylsiloxane-dimethylsiloxane copolymer, such as PDV-0325 (having a $M_w$ of about 15,500 Daltons), PDV-0331 (having a $M_w$ of about 27,000 Daltons), PDV-0525 (having a $M_w$ of about 14,000 Daltons), PDV-1625 (having a $M_w$ of about 9,500 Daltons), PDV-1631 (having a $M_w$ of about 19,000 Daltons), PDV-2331 (having a $M_w$ of about 12,500 Daltons), each available from Gelest, Inc. Exemplary vinyl-terminated silicone oils include vinyl terminated polyphenylmethylsiloxane, such as PMV-9925 (having a $M_w$ of about 2000-3000 Daltons) available from Gelest, Inc. Exemplary vinyl-terminated silicone oils include vinyl terminated diethylsiloxane-dimethylsiloxane copolymer, such as EDV-2025 (having a $M_w$ of about 16,500-19,000 Daltons) available from Gelest, Inc.

Exemplary vinyl-grafted silicone oils include vinylmethylsiloxane homopolymers, such as VMS-005 (having a $M_w$ of about 258-431 Dalton), VMS-T11 (having a $M_w$ of about 1000-1500 Daltons), both available from Gelest, Inc. Exemplary vinyl-grafted silicone oils include vinylmethylsiloxane-dimethylsiloxane copolymers, such as trimethylsiloxyl terminated silicone oils, silanol terminated silicone oils, and vinyl terminated silicone oils.

In one exemplary embodiment, the vinyl-grafted silicone oil is a vinylmethylsiloxane terpolymers, including a vinylmethylsiloxane-octylmethylsiloxane-dimethylsiloxane terpolymer, such as VAT-4325 (having a $M_w$ of about 10,000-12,000 Daltons), or a vinylmethylsiloxane-methoxypolyethylenoxypropylmethylsiloxane-dimethylsiloxane terpolymer, such as VBT-1323 (having a M of about 8,000-12,000 Daltons), or a vinylmethylsiloxane-phenylmethylsiloxane-dimethylsiloxane (having a $M_w$ of about 2,500-3,000 Daltons); each available from Gelest, Inc.

In one exemplary embodiment, the vinyl-functional silicone oil comprises a vinyl T resin or a vinyl Q resin.

In one exemplary embodiment, the silicone oil is a vinyl functional oil, such as RSI-V1303, RH-V1301 from RUNHE, such as Andril® VS 200, Andril® VS 1000 from AB Specialty Silicones.

2. Hydride Functional Silicone Oil

Another exemplary low molecular weight silicone oil may include a hydrosilicone oil having a general formula as shown below:

In one exemplary embodiment, the silicone oil comprises a hydride functional silicone oil having an organo-silicone component and Si—H groups. Exemplary hydride functional silicone oils include hydride-terminated silicone oils and hydride-grafted silicone oils in which the Si—H group is grafted onto the polymer chain, and combinations thereof.

In one exemplary embodiment, the hydride-terminated silicone oil is a hydride terminated polydimethylsiloxane such as DMS-H03 (having a $M_w$ of about 400-500 Daltons), DMS-H11 (having a $M_w$ of about 1,000-4,100 Daltons), DMS-H21 (having a $M_w$ of about 6,000 Daltons), DMS-H25 (having a $M_w$ of about 17,200 Daltons), or DMS-H31 (having a $M_w$ of about 28,000 Daltons), each available from Gelest, Inc. In one exemplary embodiment, the hydride-terminated silicone oil is a methylhydrosiloxane-dimethylsiloxane copolymer, such as a trimethylsiloxyl terminated or hydride terminated. Exemplary trimethylsiloxyl terminated copolymers include HMS-031 (having a $M_w$ of about 1,900-2,000 Daltons), HMS-071 (having a $M_w$ of about 1,900-2,000 Daltons), HMS-082 (having a M of about 5,500-6,500 Daltons), HMS-151 (having a $M_w$ of about 1,900-2,000 Daltons), HMS-301 (having a $M_w$ of about 1,900-2,000 Daltons), HMS-501 (having a $M_w$ of about 900-1200 Daltons); exemplary hydride terminated copolymers include HMS-H271 (having a $M_w$ of about 2,000-2,600 Daltons); each of which is available from Gelest, Inc. In one exemplary embodiment, the hydride-grafted silicone oil is polymethylhydrosiloxane with trimethylsiloxyl terminated, such as HMS-991 (having a $M_w$ of about 1,400-1,800 Daltons), HMS-992 (having a $M_w$ of about 1,800-2,100 Daltons), HMS-993 (having a $M_w$ of about 2,100-2,400 Daltons), each available from Gelest, Inc.

Exemplary low molecular weight silicone oils may have a weight ($M_w$) average molecular weight as little as 50 Daltons, 500 Daltons, 1000 Daltons, as great as 5000 Daltons, 10,000 Daltons, 50,000 Daltons, or within any range defined between any two of the foregoing values.

Exemplary low molecular weight silicone oils may have a kinematic viscosity as little as 0.5 cSt, 5 cSt, 100 cSt, as great as 5,000 cSt, 10,000 at, 50,000 cSt, or within any range defined between any two of the foregoing values as measured according to ASTM D445.

The TIM comprises one or more low molecular weight silicone oils in an amount as little as 0.1 wt %, 0.5 wt. %, 0.67 wt %, 1 wt. %, as great as 3 wt. %, 5 wt. %, 10 wt. %, 20 wt %, or within any range defined between any two of the foregoing values, based on the total weight of the TIM, such as 0.1 wt. % to 15 wt. %, 0.1 wt. % to 3 wt. %, or 0.67 wt. % to 10 wt. %.

c. High Molecular Weight Silicone Oil

The TIM includes a high molecular weight silicone oil as measured by gel permeation chromatography (GPC). Exemplary high molecular weight silicone oils may include a vinyl silicone oil having a general formula as shown below, similar to the low molecular weight silicone oils described above:

Vinyl functional silicone oils include an organo-silicone component with Si-CH=CH$_2$ groups. Exemplary vinyl functional silicone oils include vinyl-terminated silicone oils and vinyl-grafted silicone oils in which the Si—CH=CH$_2$ group is grafted onto the polymer chain, and combinations thereof.

Exemplary vinyl-terminated silicone oils include vinyl terminated polydimethylsiloxane, such as DMS-V41 (having a $M_w$ of about 62,700 Daltons), DMS-V42 (having a $M_w$ of about 72,000 Daltons), DMS-V46 (having a $M_w$ of about 117,000 Daltons), DMS-V51 (having a $M_w$ of about 140,000 Daltons), and DMS-V52 (having a $M_w$ of about 155,000 Daltons), each available from Gelest, Inc.

Exemplary vinyl-grafted silicone oils include vinylmethylsiloxane-dimethylsiloxane copolymers, such as trimethylsiloxyl terminated silicone oils, silanol terminated silicone oils, and vinyl terminated silicone oils.

In one exemplary embodiment, the vinyl-grafted silicone oil is a vinylmethylsiloxane terpolymers. In one exemplary embodiment, the vinyl-functional silicone oil comprises a vinyl T resin or a vinyl Q resin.

Another exemplary high molecular weight silicone oil may include a hydride functional silicone oil having an organo-silicone component and Si—H groups. Exemplary hydride functional silicone oils include hydride-terminated silicone oils, hydride-grafted silicone oils in which the Si—H group is grafted onto the polymer chain, and combinations thereof.

In one exemplary embodiment, the hydride-terminated silicone oil is a hydride terminated polydimethylsiloxane such as DMS-H41 (having a $M_w$ of about 62,700 Daltons), available from Gelest, Inc. In one exemplary embodiment, the hydride-terminated silicone oil is a methylhydrosiloxane-dimethylsiloxane copolymer, such as a trimethylsiloxyl terminated or hydride terminated. Exemplary trimethylsiloxyl terminated copolymers include HMS-064 (having a $M_w$ of about 60,000-65,000 Daltons), available from Gelest, Inc.

Exemplary low molecular weight silicone oils may have a weight ($M_w$) average molecular weight as little as 60,000 Daltons, 70,000 Daltons, 100,000 Daltons, as great as 1,000,000 Daltons, 10,000,000 Daltons, 100,000,000 Daltons, or within any range defined between any two of the foregoing values.

Exemplary high molecular weight silicone oils may have a kinematic viscosity as little as 10,000 cSt, 20,000 cSt, 100,000 cSt, as great as 1,000,000 cSt, 10,000,000 cSt, 100,000,000 cSt, or within any range defined between any two of the foregoing values as measured according to ASTM D445. In one exemplary embodiment, an exemplary high molecular weight silicone oil is a high molecular weight vinyl silicone oil having a kinematic viscosity of 2,000,000 cSt.

The TIM may comprise one or more high molecular weight silicone oils in an amount as little as 0.01 wt %, 0.1 wt. %, 0.25 wt. %, 0.5 wt. %, 0.67 wt. %, 0.75 wt. %, as great as 1 wt %, 1.5 wt. %, 2 wt. %, 5 wt. %, or within any range defined between any two of the foregoing values, based on the total weight of the TIM, such as 0.1 wt. % to 5 wt. %, 0.1 wt. % to 1 wt. %, or 0.25 wt. % to 0.67 wt %. In one exemplary embodiment, the TIM includes a high molecular weight silicone oil in the amount of about 0.6 wt. %. In another exemplary embodiment, the TIM includes a high molecular weight silicone oil in the amount of about 2.68 wt. %.

2. Catalyst

The TIM further includes one or more catalyst for catalyzing the addition reaction. Exemplary catalysts comprise platinum containing materials and rhodium containing materials. Exemplary platinum containing catalysts may have the general formula shown below:

Exemplary platinum contain catalysts include: Platinum cyclovinylmethylsiloxane complex (Ashby Karstedt Catalyst), Platinum carbonyl cyclovinylmethylsiloxane complex (Ossko catalyst), Platinum divinyltetramethyldisiloxane dimethyl fumarate complex, Platinum divinyltetramethyldisiloxane dimethyl maleate complex and the like. Exemplary of Platinum carbonyl cyclovinylmethylsiloxane complexes include SIP6829.2, exemplary of Platinum divinyltetramethyldisiloxane complex include SIP6830.3 and SIP6831.2, exemplary of platinum cyclovinylmethylsiloxane complex include SIP6833.2, all available from Gelest, Inc. Further exemplary platinum containing material catalysts include Catalyst OL available from Wacker Chemie AG, and PC065, PC072, PC073, PC074, PC075, PC076, PC085, PC086, PC087, PC088 available from United Chemical Technologies Inc.

Exemplary rhodium containing materials include Tris (dibutylsulfide)Rhodium trichloride with product code INRH078, available from Gelest, Inc.

Without wishing to be held to any particular theory it is believed that the platinum catalyst reacts with a vinyl silicone oil and a hydrosilicone oil as shown below.

The TIM may comprise the one or more catalyst in an amount as little as 5 ppm, 10 ppm, 15 ppm, 20 ppm, as great as 25 ppm, 30 ppm, 40 ppm, 50 ppm, 100 ppm, 200 ppm, 500 ppm, 1000 ppm, or within any range defined between any two of the foregoing values, based on the total weight of the silicone oil, such as 10 ppm to 30 ppm, 20 ppm to 100 ppm, or 5 ppm to 500 ppm.

In one exemplary embodiment, the catalyst is provided as a mixture with one or more of the silicone oils. In one exemplary embodiment, the platinum containing material catalyst is combined to a functional silicone oil, such as KE-1012-A, KE-1031-A, KE-109E-A, KE-1051J-A, KE-1800T-A, KE1204A, KE1218A available from Shin-Etsu, such as SILBIONE® RT Gel 4725 SLID A available from Bluestar, such as SilGel® 612 A, ELASTOSIL® LR 3153A, ELASTOSIL® LR 3003A, ELASTOSIL® LR 3005A, SEMICOSIL® 981A, SEMICOSIL® 927A, SEMICOSIL® 205A, SEMICOSIL® 9212A, SILPURAN® 2440 available from Wacker, such as Silopren® LSR 2010A available from Momentive, such as XIAMETER® RBL-9200 A, XIAMETER® R812004 A, XIAMETER® RBL-9050 A, XIAMETER® RBL-1552 A, Silastic® FL 30-9201 A, Silastic® 9202 A, Silastic® 9204 A, Silastic® 9206 A, SYLGARD® 184A, Dow Corning® QP-1 A, Dow Corning® C6 A, Dow Corning® CV9204 A available from Dow Corning.

The TIM may comprise a catalyst in an amount as little as 0.01 wt %, 0.1 wt. %, 0.2 wt. %, as great as 0.3 wt %, 0.4 wt. %, 0.5 wt. %, or within any range defined between any two of the foregoing values, based on the total weight of the TIM. In one exemplary embodiment, the TIM includes a catalyst in the amount of about 0.04 wt %. In another exemplary embodiment, the TIM includes a catalyst in the amount of about 0.4 wt. %.

In another embodiment, the platinum containing material catalyst is combined to a high molecular weight vinyl functional silicone oil.

3. Thermally Conductive Filler

The TIM includes one or more thermally conductive fillers. Exemplary thermally conductive fillers include metals, alloys, nonmetals, metal oxides and ceramics, and combinations thereof. The metals include, but are not limited to, aluminum, copper, silver, zinc, nickel, tin, indium, and lead. The nonmetal include, but are not limited to, carbon, graphite, carbon nanotubes, carbon fibers, graphenes, boron nitride and silicon nitride. The metal oxide or ceramics include but not limited to alumina (aluminum oxide), aluminum nitride, boron nitride, zinc oxide, and tin oxide.

The TIM may comprise the one or more thermally conductive fillers in an amount as little as 10 wt. %, 20 wt %, 25 wt. %, 50 wt. %, as great as 75 wt. %, 80 wt %, 85 wt. %, 90 wt. %, 95 wt. %, 97 wt. %, or within any range defined between any two of the foregoing values, based on the total weight of the TIM, such as 10 wt. % to 95 wt %, 50 wt. % to 95 wt. %, or 85 wt % to 97 wt %.

Exemplary thermally conductive fillers may have an average particle size of as little as 0.1 microns, 1 micron, 10 microns, as great as 50 microns, 75 microns, 100 microns or within any range defined between any two of the foregoing values.

In one exemplary embodiment, the TIM may include a first thermally conductive filler and a second thermally conductive filler, wherein the first thermally conductive filer has an average particle size greater than 1 micron and the second thermally conductive filler has an average particle size less than 1 micron. In a more particular embodiment, a ratio of the first thermally conductive filler to the second thermally conductive filler may be as little as 1:5, 1:4, 1:3, 1:2, as great as 1:1, 1,5:1, 2:1, 3:1, 4:1, 5:1, or within any range defined between any two of the foregoing values, such as 1:5 to 5:1 1:1 to 3:1, or 1.5:1 to 3:1.

In one exemplary embodiment, the TIM may include a first thermally conductive filler, a second thermally conductive filler, and a third thermally conductive filler, wherein the first thermally conductive filer has a particle size greater than 10 micron, the second thermally conductive filler has an average particle size as little as 1 micron, 2 microns, 4 microns, as great as 6 microns, 8 microns, 10 microns, or within any range defined therebetween, and the third thermally conductive filler has an average particle size less than 1 micron.

In one exemplary embodiment, the TIM includes a first thermally conductive filler in the amount of as little as 30 wt. %, 35 wt. %, 40 wt %, as great as 45 wt. %, 50 wt. %, 60 wt % or within any range defined between any two of the foregoing values with respect to the total TIM composition. The first thermally conductive filler has an average particle size of as little as 30 microns. 35 microns, 40 microns, as great as 45 microns, 50 microns, 60 microns, or within any range defined between any two of the foregoing values. The exemplary TIM further includes a second thermally conductive filler in the amount of as little as 5 wt. %, 10 wt %, 15 wt. %, as great as 25 wt. %, 30 wt. %, 40 wt % or within any range defined between any two of the foregoing values with respect to the total TIM composition. The second thermally conductive filler has an average particle size of as little as 1 micron, 3, microns. 5 microns, as great as 10 microns, 15 microns, 20 microns, or within any range defined between any two of the foregoing values. The exemplary TIM further includes a third thermally conductive filler in the amount of as little as 5 wt. %, 10 wt. %, 15 wt. %, as great as 25 wt. %, 30 wt %, 40 wt % or within any range defined between any two of the foregoing values with respect to the total TIM composition. The third thermally conductive filler has an average particle size of as little as 0.1 microns, 0.3, microns. 0.5 microns, as great as 1 micron, 1.5 microns, 2 microns, or within any range defined between any two of the foregoing values.

In one exemplary embodiment, the TIM includes a first thermally conductive filler in the amount of as little as 5 wt. %, 10 wt. %, 15 wt. %, as great as 25 wt. %, 30 wt. %, 40 wt % or within any range defined between any two of the foregoing values with respect to the total TIM composition. The first thermally conductive filler having an average particle size of as little as 30 microns. 35 microns, 40 microns, as great as 45 microns, 50 microns, 60 microns, or within any range defined between any two of the foregoing values. The exemplary TIM further includes a second thermally conductive filler in the amount of as little as 30 wt. %, 35 wt. %, 40 wt. %, as great as 45 wt. %, 50 wt. %, 60 wt % or within any range defined between any two of the foregoing values with respect to the total TIM composition. The second thermally conductive filler having an average particle size of as little as 1 micron, 3, microns. 5 microns, as great as 10 microns, 15 microns, 20 microns, or within any range defined between any two of the foregoing values. The exemplary TIM further includes a third thermally conductive filler in the amount of as little as 5 wt. %, 10 wt. %, 15 wt. %, as great as 25 wt. %, 30 wt. %, 40 wt % or within any range defined between any two of the foregoing values with respect to the total TIM composition. The third thermally conductive filler having an average particle size of as little as 0.1 microns, 0.3, microns. 0.5 microns, as great as 1 micron, 1.5 microns. 2 microns, or within any range defined between any two of the foregoing values.

Exemplary thermal conductive fillers include alumina oxide and zinc oxide.

4. Addition Inhibitor

The TIM comprises one or more addition inhibitors for inhibiting or limiting crosslinking of the silicone oils. The addition inhibitors includes at least one alkynyl compound, and optionally, the addition inhibitor further includes a multi-vinyl functional polysiloxane.

Exemplary addition inhibitors include acetylenic alcohols such as 1-ethynyl-1-cyclohexanol, 2-methyl-3-butyn-2-ol, 2-phenyl-3-butyn-2-ol, 2-ethynyl-isopropanol, 2-ethynyl-butane-2-ol, and 3,5-dimethyl-1-hexyn-3-ol; silylated acetylenic alcohols such as trimethyl (3,5-dimethyl-1-hexyn-3-oxy)silane, dimethyl-bis-(3-methyl-1-butyn-oxy)silane, methylvinylbis(3-methyl-1-butyn-3-oxy)silane, and ((1,1-dimethyl-2-propynyl)oxy)trimethylsilane; unsaturated carboxylic esters such as diallyl maleate, dimethyl maleate, diethyl fumarate, diallyl fumarate, and bis-2-methoxy-1-methylethylmaleate, mono-octylmaleate, mono-isooctyl-maleate, mono-allyl maleate, mono-methyl maleate, mono-ethyl fumarate, mono-allyl fumarate, 2-methoxy-1-methylethylmaleate; fumarate/alcohol mixtures, such as mixtures where the alcohol is selected from benzyl alcohol or 1-octanol and ethenyl cyclohexyl-1-ol; conjugated ene-ynes such as 2-isobutyl-1-butene-3-yne, 3,5-dimethyl-3-hexene-1-yne, 3-methyl-3-pentene-1-yne, 3-methyl-3-hexene-1-yne, 1-ethynylcyclohexene, 3-ethyl-3-butene-1-yne, and 3-phenyl-3-butene-1-yne; vinylcyclosiloxanes such as 1,3,5,7-tetramethyl-1,3,5,7-tetravinylcyclotetrasiloxane, and mixtures of conjugated ene-yne and vinylcyclosiloxane. In one exemplary embodiment, the addition inhibitor is selected from 2-methyl-3-butyn-2-ol or 3-methyl-1-pentyn-3-ol.

In some exemplary embodiments, the addition inhibitor further includes a multi-vinyl functional polysiloxane. An exemplary multi-vinyl functional polysiloxane is a vinyl terminated polydimethylsiloxane in ethynyl cyclohexanol, such as Pt Inhibitor 88 available from Wacker Chemie AG. Without wishing to be held to any particular theory it is believed that the platinum catalyst forms a complex with ethynyl cyclohexanol and vinyl terminated polydimethylsiloxane as shown below.

The formation of the complex is believed to decrease the catalyst activity in room temperature, and thus maintaining the dispensability and wettability of the TIM. At the higher temperatures of the curing step, the Pt is released from the complex and help the hydrosilylation of vinyl functional silicone oil and hydride functional silicone oil, provides greater control over the "crosslinking".

In some exemplary embodiments, the TIM may comprise the one or more addition inhibitors in an amount as little as 0.01 wt. %, 0.02 wt %, 0.05 wt. %, 0.1 wt. %, 0.15 wt. %, as great as 0.2 wt. %, 0.25 wt. %, 0.3 wt. %, 0.5 wt. %, 1 wt. %, 3 wt %, 5 wt. %, or within any range defined between any two of the foregoing values, based on the total weight of the TIM, such as 0.01 wt. % to 1 wt. %, 0.01 wt. % to 0.5 wt. %, or 0.05 wt. % to 0.2 wt. %. In one exemplary embodiment, the TIM includes an addition inhibitor in the amount of 0.1 wt %. In another exemplary embodiment, the TIM includes an addition inhibitor in the amount of 0.13 wt. %.

Without wishing to be held to any particular theory, it is believed that, in the absence of an addition inhibitor, the vinyl functional silicone oil reacts with the hydride functional silicone oil very quickly based on the addition hydrosilylation mechanism to form a solid phase that cannot be automatically dispensed by typical methods.

In one exemplary embodiment, the addition inhibitor is combined to functional silicone oils, such as KE-1056, KE-1151, KE-1820, KE-1825, KE-1830, KE-1831, KE-1833, KE-1842, KE-1884, KE-1885, KE-1886, FE-57, FE-61 available from Shin-Etsu, such as Syl-off® 7395, Syl-off® 7610, Syl-off® 7817, Syl-off® 7612, Syl-off® 7780 available from Dow Corning.

5. Optional Components

In some embodiments, the TIM may optionally include one or more of the following components: a silane coupling agent, an organic plasticizer, a surfactant, and a flux agent.

In some exemplary embodiments, the TIM comprises one or more coupling agents. Exemplary coupling agents include silane coupling agents with general formula Y—(CH$_2$)$_n$—Si—X$_3$, wherein Y is organofunctional group, X is hydrolysable group. Organofunctional group Y includes alkyl, glycidoxy, acryloxyl, methylacryloxyl, amine. Hydrolysable group X includes alkyloxy, acetoxy. In some exemplary embodiments, the silane coupling agent includes alkyltrialkoxysilanes. Exemplary alkytrialkoxy silane comprise decyltrimethoxylsilane, undecyltrimethoxylsilane, hexadecyltrimethoxysilane, octadecyltrimethoxysilane. In one exemplary embodiment, the TIM includes hexadecyltrimethoxysilane as the coupling agent's shown in the formula below.

Figure 7:
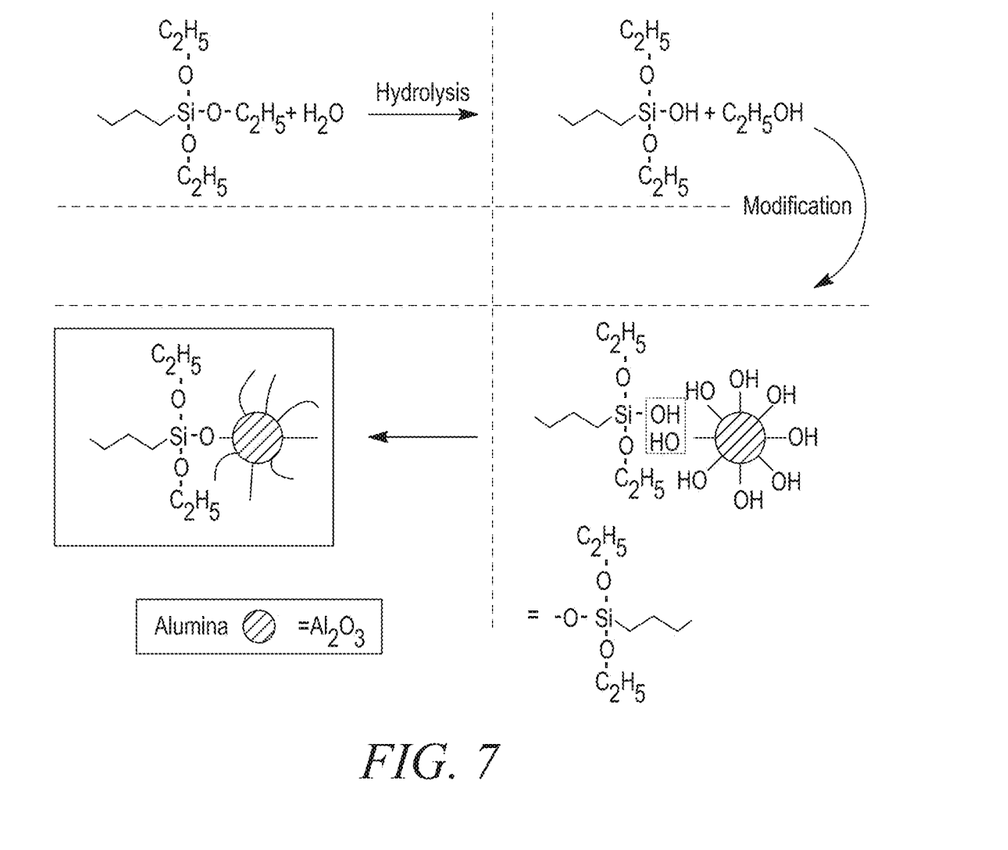
FIG. 7 is a schematic diagram showing the interaction of exemplary coupling agents with exemplary fillers.

Exemplary coupling agents interact with exemplary fillers as shown in the example reaction in FIG. 7. Alumina is the representative filler used in the reaction below; however, other alternative fillers may be used. As shown, the coupling agent is added to water and undergoes hydrolysis to remove an ethoxide group. The products then undergo a modification reaction where water is removed and the coupling agent and alumina are bonded together.

In some exemplary embodiments, the TIM may comprise the one or more coupling agents in an amount as little as 0.1 wt. %, 0.25 wt. %, 0.5 wt %, 0.67 wt. %, 0.75 wt. %, as great as 1 wt. %, 1.5 wt. %, 2 wt. %, 5 wt. %, 10 wt. %, or within any range defined between any two of the foregoing values, based on the total weight of the TIM, such as 0.1 wt. % to 10 wt. %, 0.1 wt. % to 1 wt. %, or 0.25 wt. % to 0.67 wt %.

In one exemplary embodiment, the TIM includes a coupling agent in the amount of 0.4 wt. %.

In some exemplary embodiments, the TIM comprises one or more organic plasticizers. Exemplary organic plasticizers include phthalate-based plasticizers such as Bis(2-ethylhexyl) phthalate (DEHP), Di-n-butyl phthalate (DnBP, DBP), Dioctyl phthalate (DOP or DnOP), Diethyl phthalate (DEP), Diisobutyl phthalate (DIBP), Diisodecyl phthalate (DIDP), Diisononyl phthalate (DINP), and Butyl benzyl phthalate (BBzP).

In some exemplary embodiments, the TIM may comprise the one or more organic plasticizers in an amount as little as 0.01%, 0.1 wt. %, 0.25 wt %, 0.5 wt %, 0.67 wt. %, 0.75 wt %, as great as 1 wt. %, 1.5 wt. %, 2 wt. %, 5 wt %, 10 wt. %, or within any range defined between any two of the foregoing values, based on the total weight of the TIM, such as 0.01 wt. % to 10 wt. %, 0.1 wt. % to 1 wt %, or 0.25 wt. % to 0.67 wt. %.

In some exemplary embodiments, the TIM comprises one or more surfactants. Exemplary surfactants include silicone based surface additives, such as the BYK surfactants available from BYK Chemie GmbH, including BYK-307, BYK-306, and BYK-222.

In some exemplary embodiments, the TIM may comprise the one or more surfactants in an amount as little as 0.01%, 0.1 wt. %, 0.25 wt. %, 0.5 wt. %, 0.87 wt. %, 0.75 wt %, as great as 1 wt. %, 1.5 wt %, 2 wt. %, 5 wt. %, 10 wt. %, or within any range defined between any two of the foregoing values, based on the total weight of the TIM, such as 0.1 wt % to 10 wt. %, 0.1 wt % to 1 wt %, or 0.25 wt. % to 0.67 wt. %.

In some exemplary embodiments, the TIM comprises one or more flux agents. Exemplary flux agents include fumed silica.

In some exemplary embodiments, the TIM may comprise the one or more flux agents in an amount as little as 0.1 wt. %, 0.25 wt. %, 0.5 wt. %, 0.67 wt. %, 0.75 wt. %, as great as 1 wt %, 1.5 wt. %, 2 wt. %, 5 wt. %, 10 wt. %, or within any range defined between any two of the foregoing values, based on the total weight of the TIM, such as 0.1 wt % to 10 wt. %, 0.1 wt. % to 1 wt. %, or 015 wt % to 0.67 wt. %.

6. Exemplary Formulations of the Thermal Interface Material

In a first non-limiting illustrative embodiment, the TIM includes about 2 wt. % to about 20 wt % silicone oil, about 0.1 wt. % to about 5 wt. % coupling agent, about 50 wt. % to about 95 wt. % thermally conductive filler, about 0.1 wt. % to about 5 wt. % addition inhibitor, and about 0.1 wt. % to about 5 wt. % addition catalyst.

In a second non-limiting illustrative embodiment, the TIM includes about 2 wt. % to about 10 wt. % of a first low molecular silicone oil, about 2 wt. % to about 10 wt. % of a second low molecular silicone oil, about 0.1 wt. % to about 5 wt. % of a high molecular weight silicone oil, about 0.1 wt. % to about 5 wt. % of a coupling agent, about 25 wt. % to about 50 wt. % of a first thermally conductive filler, about 25 wt % to about 50 wt. % of a second thermally conductive filler, about 25 wt. % to about 50 wt. % of a third thermally conductive filler, about 0.1 wt. % to about 5 wt. % addition inhibitor, and about 0.1 wt. % to about 5 wt. % addition catalyst.

7. Exemplary Properties of the Thermal Interface Material

In some exemplary embodiments, a thermal interface material as described above has excellent resistance to highly-accelerated stress testing (HAST). HAST testing is typically understood to relate to the resistance of the thermal interface material to humidity and temperature on the thermal performance of the thermal interface material. An exemplary HAST test standard is JESD22-A110-B. In one particular embodiment, the thermal interface material shows no dripping when placed between a glass and exemplary copper heat sink at in a vertically oriented 1.6 mm gap and subjected to 10000 thermal cycles between −55° C. and +125° C. for over one week. In other embodiments, the thermal interface material shows little to no cracking following the thermal cycling test.

In some exemplary embodiments, a thermal interface material as described above has excellent resistance to temperature cycling. Temperature cycling is typically understood to relate to the resistance of the thermal interface material to extremes of high and low temperatures, as well as its ability to withstand cyclical thermal stresses. An exemplary temperature cycling test standard is JESD22-A104-B. In one particular embodiment, the thermal interface material shows no dripping when placed between a glass an exemplary copper heat sink at in a vertically oriented 1.6 mm gap and subjected to 10000 thermal cycles between −55° C. and +125° C. over one week. In other embodiments, the thermal interface material shows little to no cracking following the temperature cycling test.

In some exemplary embodiments, a thermal interface material as described above has the thermal conductivity at least 1 W/m·K. An exemplary thermal conductivity test method standard is ASTM D5470. In one exemplary amendment, a thermal interface material as described above has the thermal conductivity of about 4 W/m·K. In another exemplary embodiment, a thermal interface material as described above has the thermal conductivity of about 2 W/m·K.

In some exemplary embodiments, a thermal interface material as described above has the viscosity in the range of 10 Pas to 100,000 Pa·s, or more particularly in the range of 100 Pa·s to 10,000 Pa·s at room temperature. An exemplary viscosity test method standard is DIN 53018. In one particular embodiment, the viscosity is tested by Brookfield Rheometer with shear rate 2 s$^{-1}$.

As applied, a thermal interface material can have a varied thickness as measured by a micrometer. In some exemplary embodiments, a thermal interface material as described above has a thickness of as little as 0.05 mm, 0.5 mm, 1 mm, as great as 3 mm, 5 mm, 7 mm, 10 mm or within any range defined between any two of the foregoing values, such as from 0.05 mm to 5 mm.

In some exemplary embodiments, a thermal interface material as described above is compressible at a given temperature when cured. In one exemplary embodiment, the thermal interface material is compressible by at least 10% at a temperature of about 25° C.

In some exemplary embodiments, a thermal interface material as described above has the dispense rate in the range of 1 g/min to 1000 g/min, or more particularly in the range of 10 g/min to 100 g/min. In one particular embodiment, the dispense rate is tested under 0.6 MPa pressure with a 10 ml syringe having a 0.1 inch diameter dispense header opening.

B. Methods of Forming a Thermal Interface Material

In some exemplary embodiments, the TIM is prepared by combining the individual components in a heated mixer and blending the composition together. The blended composition may then be applied directly to the substrate without baking.

C. Applications Utilizing the Thermal Interface Material

Referring again to FIG. 1, in some exemplary embodiments, the thermal interface material is positioned as a TIM 1 between an electronic component 12 and a heat spreader 14, as indicated by TIM 18. In some exemplary embodiments, the thermal interface material is positioned as a TIM 2 between a heat spreader 14 and a heat sink 16, as indicated by TIM 20. In some exemplary embodiments, the thermal interface material is positioned as a TIM 1.5 (not shown) between an electronic component 12 and a heat sink 16.

EXAMPLES

Example 1

A thermal interface material was prepared according to the formulation provided in Table 1.

TABLE 1

Formulations (wt. %) for Example 1

| Component | Wt. % |
|---|---|
| Low MW silicone oil A | 4.75 |
| Low MW silicone oil B | 4.75 |
| Silane coupling agent | 0.5 |
| Thermal conductive filler A | 60 |
| Thermal conductive filler B | 30 |
| Addition inhibitor | 0.1 |

Low molecular weight (MW) silicone oil A was a low molecular weight liquid silicone rubber comprising vinyl functional group. The molecular weight of the low MW silicone oil was below 50,000 Daltons and further included a platinum catalyst. Low MW silicone oil B is a liquid silicone rubber comprising hydride functional group and has a molecular weight below 58,000 Daltons. The silane coupling agent was hexadecyltrimethoxysilane. Thermal conductive filler A was aluminum particles having a particle diameter between 1 and 10 microns. Thermal conductive filler B was zinc oxide particles having a particle diameter less than 1 micron. The addition inhibitor was Pt Inhibitor 88 available from Wacker Chemie AG.

To prepare the formulation of Example 1, the silicone oil, silane coupling agent, and addition inhibitor were combined and blended with a speed mixer. The thermally conductive fillers were then added, and the mixture was blended again.

A GEL 30 Thermally Conductive Dispensable Gel from Parker Chomerics was obtained for use a comparative example. GEL 30 includes a partially cross-linked silicone rubber and alumina.

The formulation of Example 1 and the comparative example were each sandwiched between a glass and an exemplary heat sink in a vertically oriented 1.6 mm gap and subjected to thermal cycling between −55° C. and +125° C. for one week.

Figure 2A:
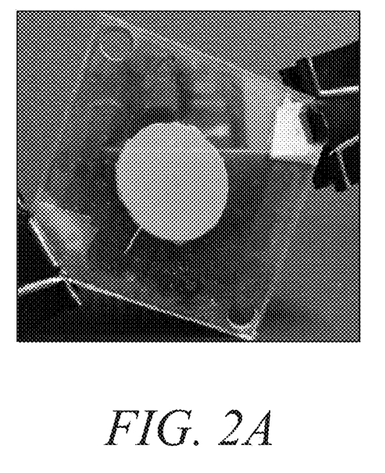
FIG. 2A is related to Example 1 and shows the sample formed from Example 1 before the thermal cycling test.
Figure 2B:
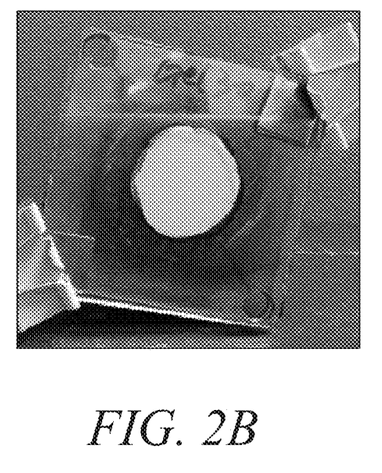
FIG. 2B is related to Example 1 and shows the sample formed from the comparative example before the thermal cycling test.
Figure 3A:
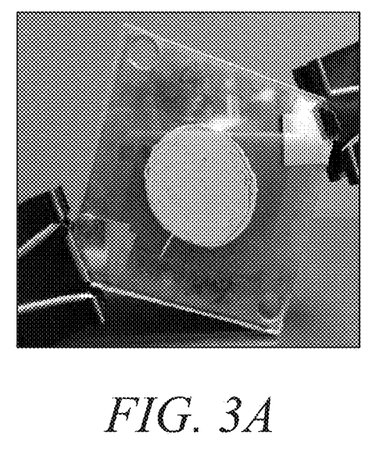
FIG. 3A is related to Example 1 and shows the sample formed from Example 1 after the thermal cycling test.
Figure 3B:
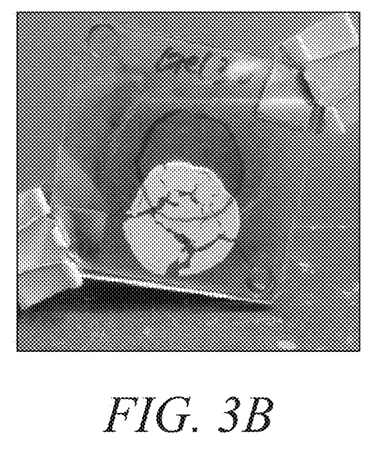
FIG. 3B is related to Example 1 and shows the sample formed from Example 1 after the thermal cycling test.

FIG. 2A shows the sample formed from Example 1 before the thermal cycling test and FIG. 2B shows the sample formed from the GEL 30 comparative example before the thermal cycling test. FIG. 3A shows the sample formed from Example 1 after the thermal cycling test and FIG. 3B shows the sample formed from the GEL 30 comparative example after the thermal cycling test.

As shown in FIG. 3A, the sample formed from Example 1 showed no dripping, as indicated by the sample maintaining its original vertical position between the glass and substrate during the test. In contrast, the sample formed from the comparative example showed significant dripping as indicated by the movement downward between FIGS. 2B and 3B.

In addition, FIG. 3A showed limited cracking of the sample formed from Example 1 due to the thermal cycling test. In contrast, FIG. 3B showed significantly more cracking in the comparative example.

Example 2

A thermal interface material was prepared according to the formulation provided in Table 2.

TABLE 2

Formulations (wt. %) for Example 2

| Component | Comp. Ex. 2 (wt. %) | Ex. 2A (wt. %) | Ex. 2B (wt. %) | Ex. 2C (wt. %) |
|---|---|---|---|---|
| Low MW silicone oil A | 5 | 4.2 | 4.6 | 3.14 |
| Low MW silicone oil B | 5 | 4.4 | 4.6 | 3.3 |
| High MW Silicone Oil | | | 0.6 | 0.9 |
| Silane coupling agent | 0.5 | 0.5 | 0.5 | 0.4 |
| Thermal conductive filler A | 60 | 60 | 60 | |
| Thermal conductive filler B | 30 | 30 | 30 | |
| Thermal conductive filler C | | | | 43.8 |
| Thermal conductive filler D | | | | 21.9 |
| Thermal conductive filler E | | | | 26.3 |
| Addition inhibitor | | 0.1 | 0.1 | 0.1 |
| Addition Catalyst | | 0.2 | 0.2 | 0.16 |

Low molecular weight (MW) silicone oil A was a low molecular weight liquid silicone rubber comprising vinyl functional group. The molecular weight of the low MW silicone oil A was below 50,000 Daltons and further Included a platinum catalyst. Low MW silicone oil B was a low molecular weight liquid silicone rubber comprising hydride functional group. The molecular weight of the low MW silicone oil B was below 50,000 Daltons. High MW silicone oil had the molecular weight higher than 60,000 Daltons. The silane coupling agent was hexadecyltrimethoxysilane. Thermal conductive filler A was aluminum oxide particles having a particle diameter between 1 and 10 microns. Thermal conductive filler B was aluminum oxide particles having a particle diameter less than 1 micron. The addition inhibitor was Pt Inhibitor 88 available from Wacker Chemie AG.

Figure 6A:
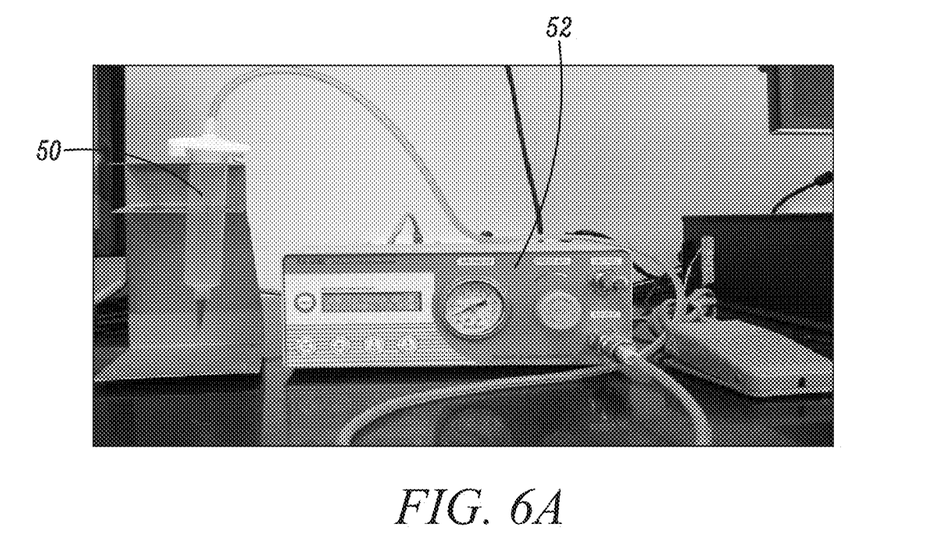
FIG. 6A shows a dispenser apparatus according to an embodiment of the present disclosure.
Figure 6B:
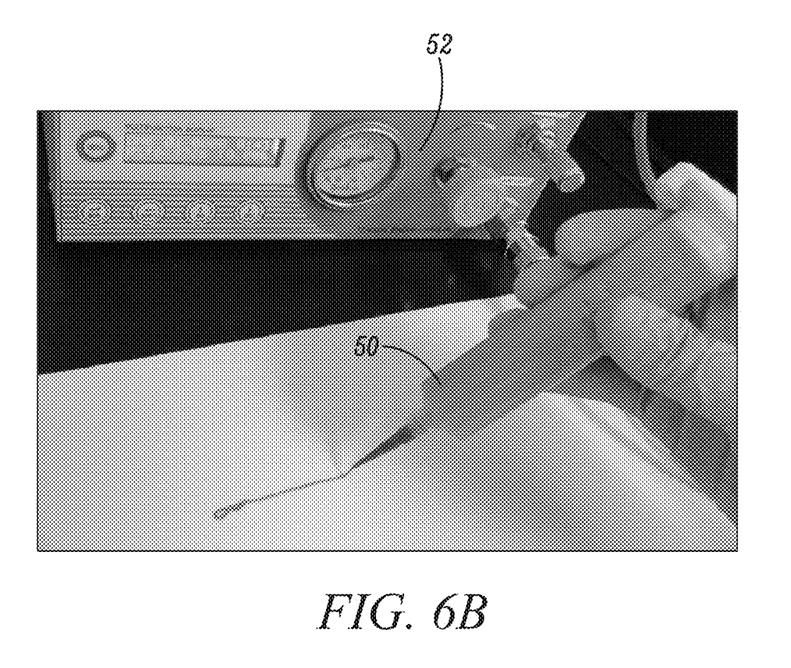
FIG. 6B shows the dispenser apparatus of FIG. 6A in operation.

After one of Comp. Ex. 2, Ex. 2A, 2B, or 2C are prepared, the prepared mixture is inserted into and sealed in a syringe 50 as shown in FIGS. 6A, 6B. Syringe 50 is connected to an automatic dispenser tool 52. The mixtures can be purged out of syringe 50 by air pressure generated by dispenser tool 52. Dispenser tool 52 also controls the orifice diameter. In effect, dispenser tool 52 controls the dispense rate of the mixtures from syringe 50 by varying the two parameters—orifice diameter and air pressure. In one embodiment, the formulation is dispensed from syringe 50 with no tip attachment at 10 cubic centimeters under a compression of 90 psi through a 0.100 inch orifice of syringe 50.

The formulation of Comp. Ex. 2, Ex. 2A, and Ex. 2B were each dispensed on an exemplary heat sink after which a glass plate was placed onto the exemplary heat sink where a 1.6 mm gap exists between the heat sink and the glass when the apparatus is vertically oriented as shown in FIG. 2A, for example. The pressure applied onto the formulation causes the formulation to spread to a desired area. There is a 1.6 mm gap between the heat sink and the glass. The glass and exemplary heat sink apparatus as described above is subjected thermal cycling between −55° C. and +125° C. for one week with each cycle having a duration of 40 minutes. A total of about 250 cycles were conducted, each individual cycle having a duration of 40 minutes.

Figure 4A:
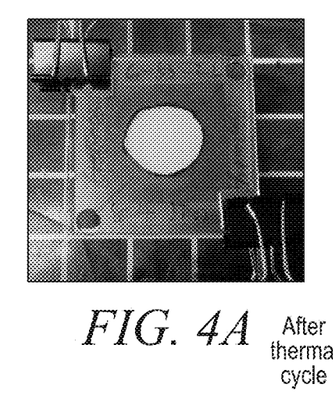
FIG. 4A is related to Example 2 and shows the sample formed from Comparative Example 2 before the thermal cycling test.
Figure 4B:
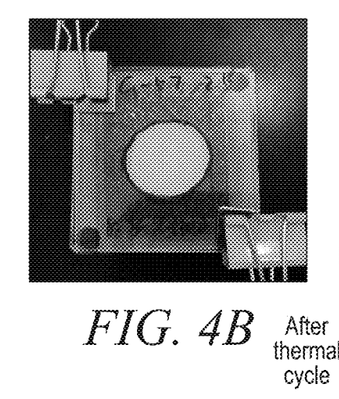
FIG. 4B is related to Example 2 and shows the sample formed from Example 2A before the thermal cycling test.
Figure 4C:
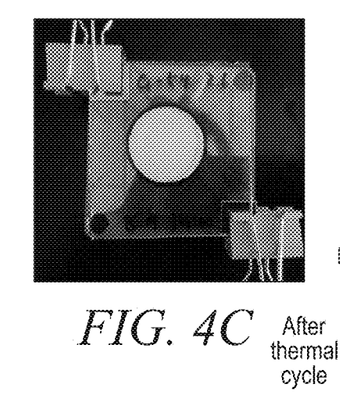
FIG. 4C is related to Example 2 and shows the sample formed from Example 2B before the thermal cycling test.

FIGS. 4A-4C shows Comp. Ex. 2, Ex. 2A, and Ex. 2B formed from Example 2 before the thermal cycling test with the resulting formulations of Comp. Ex. 2, Ex. 2A, and Ex. 2B after the thermal cycling test shown in FIGS. 5A-5C.

Figure 5A:
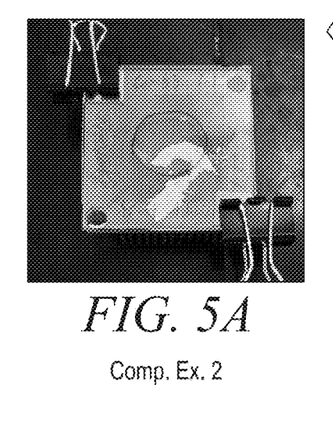
FIG. 5A is related to Example 2 and shows the sample formed from Comparative Example 2 after the thermal cycling test.
Figure 5B:
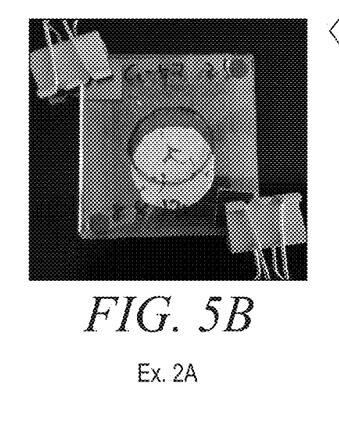
FIG. 5B is related to Example 2 and shows the sample formed from Example 2A after the thermal cycling test.
Figure 5C:
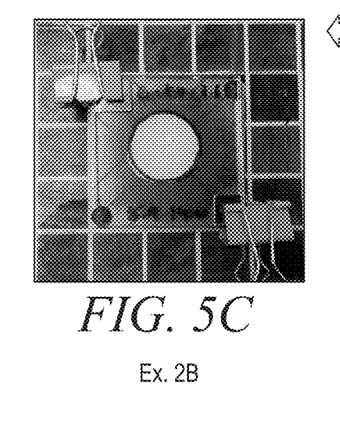
FIG. 5C is related to Example 2 and shows the sample formed from Example 2B after the thermal cycling test.

As shown in FIGS. 5A and 5B, Comp. Ex. 2 and Ex. 2A each showed significant dripping as indicated by the samples not maintaining their respective original vertical positions between the glass and substrate during the test. By contrast, as shown in FIG. 5C, Ex. 2B showed limited dripping, as indicated by the sample maintaining its original vertical position between the glass and substrate during the test.

In addition, Ex. 2B (FIG. 5C) showed limited cracking of the sample formed from Example 1 due to the thermal cycling test. By contrast, Comp. Ex. 2 and Ex. 2A (FIGS. 5A and 5B respectively) showed significantly more cracking in the comparative example.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fail within the limits of the appended claims.

The invention claimed is:

1. A thermal interface material comprising:
    at least one low molecular weight silicone oil having a weight ($M_w$) average molecular weight less than 50,000 Daltons;
    at least one thermally conductive filler; and
    at least one high molecular weight silicone oil, wherein the high molecular weight silicone oil comprises a vinyl functional silicone oil having a weight ($M_w$) average molecular weight of at least 60,000 Daltons and having a kinematic viscosity of at least 100,000 cSt.

2. The thermal interface material of claim 1, wherein the at least one low molecular weight silicone oil comprises a first silicone oil and a second silicone oil, wherein the first silicone oil is a vinyl functional silicone oil and the second silicone oil is a hydride functional silicone oil.

3. The thermal interface material of claim 1, wherein the thermally conductive filler includes a first thermally conductive filler and a second thermally conductive filler, wherein the first thermally conductive filer is a metal oxide having a particle size greater than 1 micron and the second thermally conductive filler is a metal oxide having a particle size less than 1 micron.

4. The thermal interface material of claim 1, wherein the thermally conductive filler includes a first thermally conductive filler, a second thermally conductive filler, and a third thermally conductive filler, wherein the first thermally conductive filler is a metal oxide having an average particle size greater than 10 microns, the second thermally conductive filler is a metal oxide having an average particle size between 1 micron and 10 microns, and the third thermally conductive filler is a metal oxide having an average particle size less than 1 micron.

5. The thermal interface material of claim 1, wherein the thermal interface material comprises:
    from 2 wt. % to 20 wt. % of the low molecular weight silicone oil;
    from 50 wt. % to 95 wt. % of the thermally conductive filler; and
    from 0.1 wt. % to 5 wt. % of the high molecular weight silicone oil.

6. The thermal interface material of claim 5, wherein the low molecular weight silicone oil comprises a first silicone oil and a second silicone oil, wherein the first silicone oil is a vinyl functional silicone oil and the second silicone oil is a hydride functional silicone oil.

7. A thermal interface material comprising:
    at least one high molecular weight vinyl functional silicone oil having a weight ($M_w$) average molecular weight of at least 60,000 Daltons and a kinematic viscosity of at least 100,000 cSt;
    at least one low molecular weight silicone oil having a weight ($M_w$) average molecular weight less than 50,000 Daltons;
    at least one thermally conductive filler; and
    at least one addition inhibitor, wherein the addition inhibitor comprises an alkynyl compound.

8. The thermal interface material of claim 7, wherein the addition inhibitor is selected from the group consisting of: a multivinyl functional polysiloxane, polydimethylsiloxane vinyl terminated in ethynyl cyclohexanol, 2-methyl-3-butyn-2-ol, and 3-methyl-1-pentyn-3-ol.

9. The thermal interface material of claim 7, wherein the thermally conductive filler includes a first thermally conductive filler and a second thermally conductive filler, wherein the first thermally conductive filer is a metal having a particle size greater than 1 micron and the second thermally conductive filler is a metal oxide having a particle size less than 1 micron.

10. The thermal interface material of claim 9, wherein a ratio of the first thermally conductive tiller to the second thermally conductive filler is from 1.5:1 to 3:1.

11. The thermal interface material of claim 7, wherein the thermal interface material comprises:
    from 2 wt. % to 20 wt. % of the silicone oils;
    from 0.1 wt. % to 5 wt. % of a silane coupling agent;
    from 50 wt. % to 95 wt. % of the thermally conductive filler; and
    from 0.01 wt. % to 5 wt. % of the addition inhibitor.

12. The thermal interface material of claim 11, wherein the addition inhibitor is polydimethylsiloxane vinyl terminated in ethynyl cyclohexanol.

13. An electronic component comprising:
    a heat sink;
    an electronic chip;
    a thermal interface material having a first surface layer and a second surface layer, the thermal interface material positioned between the heat sink and electronic chip, the thermal interface material including:
        at least one silicone oil having a kinematic viscosity of at least 100,000 cSt;
        at least one thermally conductive filler; and
        at least one addition inhibitor, wherein the addition inhibitor comprises an alkynyl compound, wherein the at least one silicone comprises at least one low molecular weight silicone oil and at least one high molecular weight silicone oil.

14. The electronic component of claim 13, wherein the at least one high molecular weight silicone oil comprises a vinyl functional silicone oil having a weight ($M_w$) average molecular weight of at least 60,000 Daltons.

15. The electronic component of claim 13, wherein the first surface layer is in contact with a surface of the electronic chip and the second surface layer is in contact with the heat sink.

16. The electronic component of claim 13, wherein the electronic component further comprises a heat spreader positioned between the heat sink and the electronic chip, wherein the first surface layer is in contact with a surface of the electronic chip and the second surface layer is in contact with the heat spreader.

17. The electronic component of claim 13, the electronic component further comprises a heat spreader positioned between the heat sink and the electronic chip, wherein the first surface layer is in contact with a surface of the heat spreader and the second surface layer is in contact with the heat sink.

18. The thermal interface of claim 1, wherein the at least one high molecular weight silicone oil has a weight ($M_w$) average molecular weight of at least 1,000,000 Daltons and having a kinematic viscosity of at least 1,000,000 cSt.

19. The thermal interface of claim 1, wherein the at least one low molecular weight silicone oil has a kinematic viscosity of less than 5,000 cSt.

\* \* \* \* \*